United States Patent
Garvik et al.

(10) Patent No.: US 12,362,705 B2
(45) Date of Patent: Jul. 15, 2025

(54) OSCILLATOR REGULATION

(71) Applicant: Nordic Semiconductor ASA, Trondheim (NO)

(72) Inventors: Harald Garvik, Trondheim (NO); Erlend Strandvik, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 18/290,273

(22) PCT Filed: May 11, 2022

(86) PCT No.: PCT/EP2022/062746
§ 371 (c)(1),
(2) Date: Nov. 10, 2023

(87) PCT Pub. No.: WO2022/238463
PCT Pub. Date: Nov. 17, 2022

(65) Prior Publication Data
US 2024/0267000 A1    Aug. 8, 2024

(30) Foreign Application Priority Data
May 12, 2021    (GB) ..................... 2106734

(51) Int. Cl.
*H03B 5/32* (2006.01)
*H03B 5/36* (2006.01)
*H03L 5/00* (2006.01)

(52) U.S. Cl.
CPC ............... *H03B 5/32* (2013.01); *H03L 5/00* (2013.01); *H03B 5/36* (2013.01);
(Continued)

(58) Field of Classification Search
CPC .... H03B 2200/0094; H03B 2200/0012; H03B 2200/0066; H03B 5/32; H03B 5/06;
(Continued)

(56) References Cited

U.S. PATENT DOCUMENTS 8,729,971 B2    5/2014  Kubota
10,418,941 B2   9/2019  Kumar et al.
(Continued)

OTHER PUBLICATIONS

IPO Combined Search and Examination Report under Sections 17 and 18(3) for GB 2106734.3, dated Sep. 29, 2021, 6 pages.
(Continued)

*Primary Examiner* — Ryan Johnson
(74) *Attorney, Agent, or Firm* — Klarquist Sparkman, LLP (57) ABSTRACT

Provided is a method for controlling the bias current, $I_{PIERCE}$, of an oscillator. The method includes acquiring or determining a digital representation encoding a bias current. The method also includes carrying out an algorithm to update the digital representation if the oscillation amplitude is measured, by one or more peak detectors, to be outside of upper and lower thresholds. Also provided is an apparatus arranged to control the bias current of an oscillator using this method, the apparatus including one or more peak detectors and a current digital to analogue converter.

24 Claims, 4 Drawing Sheets

(52) U.S. Cl.
CPC ............... *H03B 2200/0012* (2013.01); *H03B 2200/0066* (2013.01); *H03B 2201/031* (2013.01)

(58) Field of Classification Search
CPC .. H03B 2200/0062; H03B 5/36; H03B 5/364; H03B 5/362; H03B 2200/0046; H03L 3/00; H03L 5/00
See application file for complete search history.

(56) References Cited

U.S. PATENT DOCUMENTS

| | | | |
|---|---|---|---|
| 2003/0001684 A1* | 1/2003 | Magoon | H03L 7/099 331/182 |
| 2008/0122549 A1 | 5/2008 | Greenberg | |
| 2013/0002365 A1 | 1/2013 | Zoppi et al. | |
| 2014/0091869 A1* | 4/2014 | Tham | H03B 5/06 331/109 |
| 2014/0266487 A1* | 9/2014 | Vaishnav | H03K 5/082 331/183 |
| 2016/0033567 A1* | 2/2016 | Thakur | H03B 5/32 331/64 |
| 2017/0237441 A1 | 8/2017 | Peltonen et al. | |
| 2018/0054163 A1 | 2/2018 | Chen et al. | |

OTHER PUBLICATIONS

International Search Report and Written Opinion for PCT/EP2022/062746, mailed Sep. 8, 2022, 15 pages.

\* cited by examiner

OSCILLATOR REGULATION

CROSS REFERENCE TO RELATED APPLICATIONS

This is the U.S. National Stage of International Application No. PCT/EP2022/062746, filed May 11, 2022, which was published in English under PCT Article 21 (2), which in turn claims the benefit of Great Britain Application No. 2106734.3, filed May 12, 2021.

This invention relates to a method and apparatus for digital amplitude control of oscillators, in particular Pierce oscillators.

Electronic oscillators can convert a direct current (DC) power supply to an alternating current (AC) to provide periodic signals at a certain frequency.

Some electric oscillators use piezoelectric crystals. These oscillators are known as crystal oscillators. In crystal oscillators, the frequency of the periodic signal generated by the circuit is determined by the resonant frequency of the crystal. It is understood in the art that such crystals may have a relatively high Q factor and also have better temperature stability than other types of oscillator circuits.

Pierce oscillators are a type of electronic oscillator common in integrated circuit chips which are particularly suited for use as piezoelectric crystal oscillators.

In order to start oscillations in the crystal a current must be supplied. However, changing the current in turn changes the oscillation amplitude in the circuit. It is generally necessary to control the current supplied to the Pierce inverter—referred to herein as the bias current (or $I_{PIERCE}$)—such that the gain is just above the level where oscillations are maintained. It is not desirable to supply too much current as this simply increases overall power consumption.

It is known to use an analogue amplitude regulator to provide a suitable bias current to Pierce oscillators. However, the Applicant has appreciated that existing analogue amplitude regulators typically consume a lot of power. They can also introduce undesirable noise into the circuit causing clock jitter.

The present invention seeks to address these shortcomings and from a first aspect, the invention provides a method for controlling the bias current of an oscillator, the method comprising:

a) acquiring a digital representation encoding a bias current;
b) monitoring an oscillation amplitude of the oscillator at a node using one or more peak detectors;
c) using the peak detector(s) to carry out a comparison of the oscillation amplitude at the node with an upper amplitude threshold and a lower amplitude threshold,
d) if the comparison determines that said oscillation amplitude is greater than said upper amplitude threshold, updating said digital representation to encode a reduced bias current and storing said updated digital representation;
e) if the comparison determines that said oscillation amplitude is lower than said lower amplitude threshold updating said digital representation to encode an increased bias current and storing said updated digital representation; and
f) repeating steps b) to e) using said updated digital representation as said digital representation.

Thus it will be seen that, in accordance with the invention, one or more peak detectors are used for digitally controlling the bias current of an oscillator (e.g. a Pierce oscillator). The peak detectors compare the oscillation amplitude at a node with two thresholds. If the peak detectors determine that the oscillation amplitude is not between the upper and lower thresholds, in response, the bias current is updated by updating a digital representation encoding said current (e.g. a current-DAC (IDAC) code). Changing the bias current of the oscillator in turn affects the oscillation amplitude. By using one or more peak detectors with two thresholds, it can be determined if the amplitude is above or below a legal range and the digital representation encoding the bias current can be adjusted accordingly to keep the oscillation amplitude within the legal range. This method may be referred to herein as an amplitude regulation algorithm.

A benefit which may be achieved in accordance with the invention, is that the bias current supplied to the oscillator may be changed if an environmental change occurs at some point. This environmental change could be a change in operating temperature, which in turn would affect the oscillation amplitude at the node, thus, necessitating a new digital representation. The amplitude regulation algorithm may be run for as long as the oscillator runs, to 'watch' for such changes and compensate for them by controlling the bias current.

Traditionally, analogue amplitude regulators are used to provide the correct bias current to (e.g. Pierce) oscillators. However, methods and apparatus in accordance with the invention control the amplitude in the digital domain. Implementing amplitude control in the digital domain allows for more flexibility for designers as it is possible to develop and adapt amplitude control regulation algorithms in digital hardware or software.

Furthermore, in accordance with the invention, undesirable noise which is usually presented by analogue amplitude control circuits can be removed. Therefore, jitter in clock signals caused by such noise may be reduced.

The Applicant has appreciated that having the one or more peak detectors continuously running draws a significant amount of current which can increase the power consumption of the digital amplitude control circuit. Therefore, in a set of embodiments, a sleep state is entered wherein the peak detector(s) is/are disabled before repeating steps b) to e). Furthermore, in a set of embodiments if the oscillation amplitude is between the upper amplitude threshold and the lower amplitude threshold the sleep state is entered without updating the digital representation. In such a sleep state less current may be consumed compared to existing analogue methods. This is because the peak detector(s) only need to be powered up intermittently. As mentioned above, the bias current supplied to the oscillator may be changed to compensate for an environmental change (e.g. temperature). By intermittently enabling the peak detector(s) between sleep states and running steps b) to e) of the algorithm, these environmental changes may be compensated for, without drawing as much power as typical amplitude control circuits.

In a set of embodiments, the sleep state is maintained for a predetermined time. The magnitude of said predetermined time may be chosen based on the frequency of the oscillator. For example, for a 32 kHz oscillator, the sleep state may be maintained for a predetermined time lasting between 5 ms and 250 ms—e.g. between 40 ms and 140 ms. The longer the sleep state is maintained the further power consumption can be reduced. However, the predetermined time spent in the sleep state set is preferably chosen such that the oscillator is unlikely to go from an acceptable oscillation amplitude (i.e. within the upper and lower thresholds) to a non-functional clock within the time spent in the sleep state. In some example embodiments, wherein the oscillator is a crystal oscillator, the predetermined time may be chosen in relation to crystal parameters. For example, wherein the oscillator comprises a crystal having an inductance and an equivalent series resistance, the predetermined time may be chosen to be approximately equal to (e.g. within ±20%) the Inductance (L) divided by the Equivalent Series Resistance (ESR) of the crystal (or L/ESR) which has been identified by the Applicant to give a suitable time for maintaining the sleep state. The ability to set and optionally change, e.g. in software, the time spent in the sleep state helps to provide flexibility for designing low-power digital amplitude regulation algorithms.

The digital representation may be updated by incrementing or decrementing said digital representation by a first constant. In a set of embodiments, the digital representation is updated by incrementing or decrementing said digital representation by said first constant, then subsequently a bias current is supplied to the oscillator encoded by a temporary digital representation comprising said updated digital representation additionally shifted up or shifted down by a second constant. When updating the digital representation encoding the bias current, temporarily supplying a higher or lower bias current to the oscillator may help to bring the oscillation amplitude within an acceptable range more quickly. The current encoded by the temporary digital representation may be supplied to the oscillator before supplying the current encoded by the updated digital representation.

However, if shifting the digital representation up or down by the first and/or second constant gives a value above a maximum value or below a minimum value, then instead a bias current may be supplied which is encoded by a temporary digital representation having said maximum value or minimum value. Therefore, in a set of embodiments, after updating the digital representation by incrementing or decrementing said digital representation by said first constant, the amplitude regulation algorithm comprises, subsequently:

determining the value of a temporary digital representation comprising the updated digital representation additionally shifted up or shifted down by a second constant; and
    if the value of the temporary digital representation is between a maximum or minimum value, supplying a bias current to the oscillator encoded by the temporary digital representation; or
    if the value of the temporary digital representation is above a maximum value, supplying a bias current encoded by a temporary digital representation having said maximum value; or
    if the value of the temporary digital representation is below a minimum value, supplying a bias current encoded by a temporary digital representation having said minimum value;
  before supplying the bias current encoded by the updated digital representation.

In a set of embodiments, the temporary digital representation is changed to the updated digital representation after determining, using the one or more peak detector(s), that the oscillation amplitude is within said upper amplitude threshold and said lower amplitude threshold. Initially supplying a bias current encoded by the temporary digital representation also helps to ensure that the oscillation amplitude is not outside of the acceptable range for too long.

Prior to digital amplitude regulation, it is necessary to acquire the digital representation. The digital representation may be stored in a memory and acquired from said memory, for example, when the oscillator is powered up. For example, the digital representation may simply be set as a mid-range value—e.g. a median value—or some other fixed value. However, in a set of embodiments, an initial search algorithm is first carried out to determine a digital representation encoding a bias current which gives an oscillation amplitude within said upper amplitude threshold and said lower amplitude threshold, the initial search algorithm comprising:

g) acquiring an initial digital representation encoding a bias current, and setting an active bit as a most significant bit thereof, the most significant bit having a first value;
  h) monitoring the oscillation amplitude at the node using the one or more peak detectors;
  i) using the peak detector(s) to carry out a comparison of the oscillation amplitude at the node with the upper amplitude threshold and the lower amplitude threshold at the one or more peak detectors;
  j) if the comparison determines that said oscillation amplitude is greater than said upper threshold, updating said initial digital representation by inverting the active bit to a second value to encode a reduced bias current and, if said active bit is not a least significant bit, setting a next most significant bit to said first value and setting said next most significant bit as the active bit;
  k) if the comparison determines that said oscillation amplitude is lower than said lower threshold updating said initial digital representation by maintaining the active bit or setting the active bit to said first value and setting a next most significant bit to said first value to encode an increased bias current and setting said next most significant bit as the active bit; and
  l) repeating steps h) to k) using said updated digital representation as said initial digital representation.

Therefore, the initial search algorithm may eventually find a suitable digital representation for encoding a bias current giving an oscillation amplitude between said upper and lower thresholds. In a set of embodiments, the initial search algorithm further comprises maintaining the initial digital representation if the comparison determines that said oscillation amplitude is between said upper amplitude threshold and said lower amplitude threshold. Hence, the maintained initial digital representation may encode a suitable bias current for giving an oscillation amplitude which falls within a 'legal range'—i.e. defined by the upper and lower thresholds.

In a set of embodiments, the digital representation determined by the initial search algorithm is used as the digital representation set out in accordance with the first aspect of the invention. This means that the amplitude regulation algorithm of the first aspect may be preceded by the initial search algorithm. The initial search algorithm thus provides a digital representation encoding a bias current which is likely to give an oscillation amplitude between the upper and lower thresholds. In other words, the initial search algorithm provides a starting point which is likely to result in a bias current being supplied that is most suitable for the oscillator.

The initial search algorithm may be carried out once. The result of the search (i.e., a digital representation) may be stored in the memory for it to be retrieved at start-up. Therefore, a digital representation encoding a bias current may be retrieved from memory in place of the initial search algorithm.

The initial digital representation may have any suitable value. In a set of embodiments, however, the initial search algorithm's initial digital representation has a median value of a range of possible values. For example, a median value may be achieved if the digital representation is a multi-bit code, wherein the most significant bit is set high and the remaining bits are set low. For example, a 5 bit code has a range of values between 1 and 31, with a median value of 16 which is encoded by 10000 (the most significant bit being 1 and the rest being 0). The median value may correspond to a current that is expected to be the most suitable current for the oscillator.

There may be certain fault conditions that are checked to ensure that the digital representation is not adjusted beyond certain limits. Having such fault conditions may allow for certain issues to be detected. In a set of embodiments, the initial search algorithm enters an error state if the comparison determines that said oscillation amplitude is above said upper amplitude threshold wherein:

the digital representation has a minimum value of a range of possible values.

If the digital representation has a minimum value, it can no longer be reduced while maintaining a non-zero current. Therefore, if the peak detector(s) determine that the oscillation amplitude is too high while providing the minimum possible bias current, it can be concluded that an error has occurred.

In a set of embodiments, the initial search algorithm enters an error state if, after all bits of the digital representation have been the active bit (indicating that the search has reached the end), the digital representation does not bring the oscillation amplitude into the 'legal' range i.e. between the upper and lower thresholds. For example this would occur where the active bit is a least significant bit and neither setting it to the first nor the second value brings the oscillation amplitude into the 'legal' range. This may help to bring attention to a potential problem with the crystal.

Upon entering an error state, an error signal may be asserted. This may result in an alert to an operator that there has been a fault.

In a set of embodiments, the initial search algorithm comprises, upon determining that the oscillation amplitude is greater than said upper amplitude threshold, temporarily setting the digital representation to a minimum value until the oscillation amplitude at said node has decreased to be below said upper amplitude threshold. Similarly, in a set of embodiments, the initial search algorithm comprises, upon determining that said oscillation amplitude is lower than said lower amplitude threshold, temporarily setting the digital representation to a maximum value until the oscillation amplitude at said node has increased to be higher than said lower amplitude threshold.

Temporarily setting the digital representation to a maximum or minimum value, in the initial search algorithm, helps to ensure that the oscillation amplitude is quickly brought to a 'legal range'—i.e. defined by the upper and lower thresholds. This provides effectively the same advantage as the previously mentioned feature of setting a temporary digital representation in the amplitude regulation algorithm. However, this mechanism may further provide a safety feature that ensures that the peak detector(s) are not triggered when starting another cycle of the initial search algorithm. Without this feature, the oscillation amplitude may quickly become too high or too low.

In a set of embodiments, the initial search algorithm enters an error state if, after setting the digital representation to a minimum or maximum value, a predetermined time has passed without the one or more peak detectors determining that the oscillation amplitude at the node is between said lower amplitude threshold and said upper amplitude threshold. In embodiments where the oscillator is a crystal oscillator, this fault condition may help to signify if a crystal has been incorrectly inserted.

In a set of embodiments, the initial search algorithm comprises waiting a predetermined time, after setting the digital representation to the updated digital representation (supplying the oscillator with a corresponding bias current) and before monitoring the oscillation amplitude at the node using the one or more peak detectors. This helps to allow for transients to settle. The transients may be associated with switching the digital representation from the maximum or minimum value to the updated digital representation. Said predetermined time (e.g. for a 32 kHz oscillator) may be between 2 ms and 10 ms—e.g. between 4 ms and 6 ms—e.g. 5 ms.

The initial search algorithm may comprise waiting for the one or more detectors to determine whether the oscillation amplitude is higher than the upper threshold or lower than the lower threshold; and if the time spent waiting exceeds a predetermined time, finishing the search. This may occur after the digital representation is updated and after a bias current represented by said updated digital representation is applied to the oscillator. For example, the algorithm may wait said predetermined time for one of the peak detectors to trigger, indicating a 'violation'—e.g. meaning that the oscillation is higher than the upper threshold or lower than the lower threshold. If the time spent waiting for a violation takes longer than said predetermined time, it is likely that the bias current encoded by the digital representation at that point is suitable for providing an oscillation amplitude within said upper and lower thresholds. The predetermined time (e.g. for a 32 kHz oscillator) may be between 1 s and 3 s—e.g. 2 s.

The initial search algorithm may be implemented in software. The amplitude regulation algorithm may be implemented in digital hardware—e.g. in digital hardware made by a digital designer with digital design tools, which in turn means that the algorithm may be specified as register-transfer level (RTL) code.

Preferably, the initial search algorithm is triggered by a change of crystal in the oscillator and/or by a change in load capacitance.

In a set of embodiments, prior to the initial search algorithm, an initial bias current may be set so that the oscillation amplitude exceeds the upper amplitude threshold—e.g. at startup. This ensures that the initial bias current is large enough to start oscillation of the oscillator in a reasonable amount of time. The initial bias current (e.g. for a 32 kHz oscillator) may be between 200 nA and 2000 nA—e.g. 850 nA.

Preferably, a first flag is set if the oscillation amplitude at the node is determined by the one or more peak detectors to be higher than the upper amplitude threshold or a second flag is set if the oscillation amplitude at the node is determined by the one or more peak detectors to be lower than the lower amplitude threshold.

In a set of embodiments, the bias current is provided by a current analogue to digital converter (IDAC). The IDAC is typically arranged to output an analogue signal having a current corresponding to the digital representation received (e.g. at its input).

In a set of embodiments, the oscillator is a Pierce oscillator. Therefore, the IDAC may be arranged to provide the bias current to a Pierce oscillator.

The oscillator may comprise a crystal connected between a first crystal terminal and a second crystal terminal. In a set of embodiments, the node at which the oscillation amplitude is monitored is located at one of said first and second terminals. Therefore, the first crystal terminal or the second crystal terminal may be used as a peak detector input.

The combination of finding a suitable digital representation encoding a bias current in an initial search algorithm with a further algorithm being different to the initial search algorithm (e.g. preferably requiring less power) is novel and inventive in its own right. Thus, according to a second aspect the invention provides a method for controlling a bias current of an oscillator having an oscillation amplitude, the method comprising:

carrying out an initial search algorithm, to determine a digital representation encoding a bias current for providing an oscillation amplitude between an upper threshold and a lower threshold;

applying a bias current to said oscillator using a digitally controlled current generated based on said determined digital representation; and subsequent to the initial search algorithm, carrying out an amplitude regulation algorithm to update the digital representation if the oscillation amplitude is measured, by one or more peak detectors, to be outside of said upper and lower thresholds, the amplitude regulation algorithm being different to the initial search algorithm.

Thus it will be seen that, in accordance with the second aspect of the invention, two different algorithms are used to digitally control the oscillation amplitude of the oscillator. The initial search algorithm first determines the digital representation (e.g. the IDAC code) that yields the correct oscillation amplitude. Then an amplitude regulation algorithm updates (e.g. by stepping the digital representation up or down by a certain amount) every time step that the one or more peak detector(s) trigger. The amplitude regulation algorithm may be run continuously in the background to watch for amplitude changes due to changing temperature.

This invention extends to an apparatus arranged to control the bias current of an oscillator, the apparatus comprising:
one or more peak detectors; and
a current digital to analogue converter;
wherein the apparatus is arranged to:
a) acquire a digital representation, for the current digital to analogue converter to receive, said digital representation encoding a bias current for supplying to the oscillator;
b) monitor an oscillation amplitude of the oscillator at a node using the one or more peak detectors; and
c) use the peak detector(s) to carry out a comparison of the oscillation amplitude at the node with an upper amplitude threshold and a lower amplitude threshold, wherein:
d) if the comparison determines that said oscillation amplitude is greater than said upper amplitude threshold, update said digital representation to encode a reduced bias current and store said updated digital representation;
e) if the comparison determines that said oscillation amplitude is lower than said lower amplitude threshold, update said digital representation to encode an increased bias current and store updated digital representation; and wherein
f) repeat steps b) to e) using said updated digital representation as said digital representation.

Features of any aspect or embodiment described herein may, wherever appropriate, be applied to any other aspect or embodiment described herein.

It will be appreciated by those skilled in the art that all aspects and embodiments of the present invention can include, as appropriate, any one or more or all of the preferred and optional features described herein. For example, the amplitude regulation algorithm of the second aspect may correspond to the method of the first aspect.

Where reference is made to different embodiments or sets of embodiments, it should be understood that these are not necessarily distinct but may overlap.

Certain embodiments of the invention will now be described, by way of example only, with reference to the accompanying drawings, in which.

Figure 1:
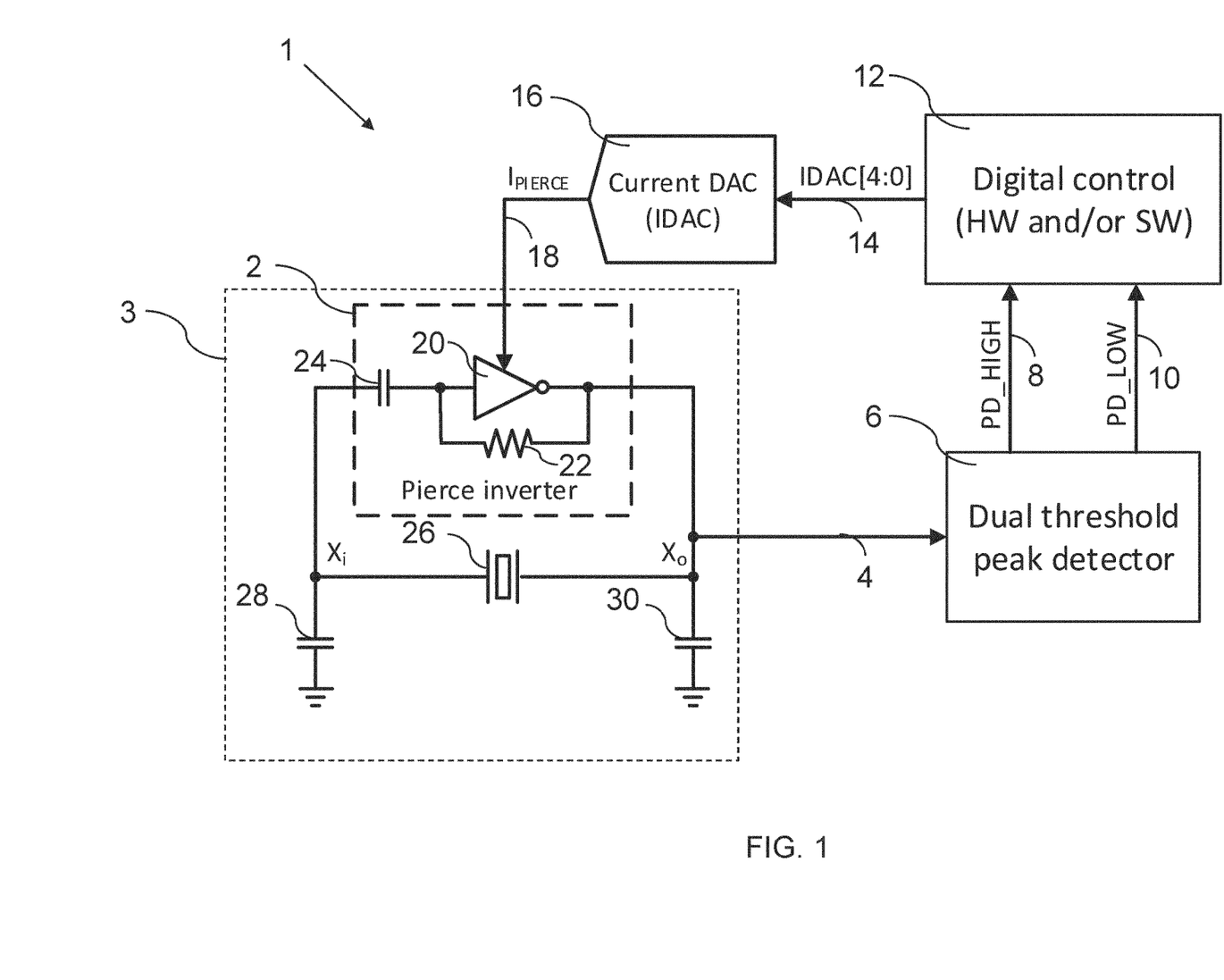
FIG. 1 is a schematic showing a digital amplitude control circuit portion in accordance with an embodiment of the invention.

FIG. 1 shows a block schematic of a digital amplitude control circuit portion 1 comprising a Pierce oscillator 3, in accordance with an embodiment of the invention. The Pierce oscillator 3 comprises an amplifying portion 2 comprising an inverter amplifier 20 (herein referred to as the Pierce inverter). The Pierce inverter 20 is connected to a resistor 22 in parallel, such that the input of the Pierce inverter 20 is connected to one terminal of the resistor 22 and its output is connected to the other terminal of the resistor 22. The resistor 22 sets the DC level and biases the inverter 20 into its linear operating region. The Pierce inverter 20 is also connected (via its input) to a capacitor 24 in series.

A piezoelectric crystal 26 is connected to the amplifying portion 2, in parallel, between two nodes $X_i$ and $X_o$. Each node ($X_i$ and $X_o$) is connected to ground via a respective capacitor 28, 30. These capacitors 28, 30 could be off-chip, however, in this example, they are on-chip capacitors 28, 30.

The Pierce oscillator 3 is connected (via the node $X_o$ and the connection 4) to a dual threshold peak detector 6. The peak detector 6 has two signal lines (PD_HIGH, PD_LOW) 8,10 connected to a digital control module 12. The digital control module 12 is connected to a current digital-to-analogue converter (IDAC) 16 (via a five-bit digital connection 14). The output of the IDAC 16 is connected to the (power terminal of the) Pierce inverter 20 via a connection 18 labelled $I_{PIERCE}$.

The operation of the circuit portion shown in FIG. 1 will now be described. The Pierce oscillator 3 uses a feedback loop comprising the Pierce inverter 20 to generate a fixed frequency output. The piezoelectric crystal 26 is used as the frequency selective element. In use, the crystal 26 mechanically vibrates in response to an applied electric field at a frequency slightly above its series resonant frequency.

The Pierce Inverter 20 by itself provides a phase shift of 180 degrees. The capacitors 28, 30 (which connect the terminals of the crystal 26 to ground), form a pi network band-pass filter with the crystal 26. This band-pass filter arrangement provides a 180 degree phase shift (i.e. an inverting gain) and satisfies the Barkhausen criteria. The combination of this 180 degree phase shift together with the negative gain from the Pierce inverter 20 provides positive loop gain and thus positive feedback which results in the desired oscillations.

The components external to the Pierce oscillator 3, enable the oscillation amplitude to be digitally regulated in accordance with embodiments of the invention, the operation of which will now be described with reference to FIG. 1.

The peak detector 6 compares the amplitude of the voltage at the node $X_o$ with pre-defined upper and lower thresholds. The nominal thresholds are selected in the design stages by choosing resistor values. The thresholds are trimmable and can be tuned in production testing in order to provide the required operating conditions. Threshold trimming data is stored in a memory (not shown) e.g. a register.

A first flag PD_HIGH is asserted by the peak detector 6 on one of the output signal lines 8 if the peak detector 6 determines that a measured amplitude is higher than the upper threshold. A second flag PD_LOW is asserted by the peak detector 6 on the other signal line 10 if the peak detector 6 determines that a measured amplitude is lower than the lower threshold.

The signal lines 8, 10 are input to the digital control module 12 which may be implemented in hardware and/or software and which adjusts the oscillator bias current ($I_{PIERCE}$) by means of a digital representation, or IDAC code, at its output 14 controlling the current-DAC (IDAC) 16. The digital control module 12 adjusts the bias current based on the flags asserted by the peak detector 6.

In order to implement digital amplitude control, two main algorithms are used. The first is an initial binary search-based algorithm that can quickly go through all the IDAC codes to find the one that yields the correct oscillation amplitude. The second is a simpler algorithm behaving like a digital integrator, stepping the IDAC code up or down by a certain amount every time the peak detector 6 is triggered. This algorithm is run continuously in the background with a long time step to watch for gradual amplitude changes—e.g. due to changing temperature.

The Pierce oscillator 3 forms an oscillating feedback loop around the crystal 26. The dual threshold peak detector 6 monitors the oscillation amplitude at $X_o$ and sets its output flags accordingly. PD_HIGH is set if the $X_o$ amplitude is higher than a pre-determined upper threshold, and PD_LOW if the $X_o$ amplitude is lower than a pre-determined lower threshold. The aim is to keep the oscillation amplitude between the upper and lower thresholds. That is, to keep both peak detector 6 flags cleared. The peak detector flags are cleared (i.e. unset) when the peak detector 6 determines that the oscillation amplitude is within the 'legal' amplitude range—i.e. between the upper and lower threshold oscillation amplitude thresholds. In this example, the peak detector 6 thresholds are trimmable—e.g. they stored in a register and adjusted via editing software.

When the measured amplitude triggers the peak detector 6 to set a flag, the digital control module 12 reads the flag (PD_HIGH or PD_LOW), which in turn controls the current DAC (IDAC) which supplies the current $I_{PIERCE}$ to the inverter 20. A negative amplitude control loop is thus formed. The task of the digital control module 12 is to select a lower IDAC code to clear a PD_HIGH flag, and a higher IDAC code to clear a PD_LOW flag.

The IDAC 16 is 5 bits and binary scaled in the implementation shown in FIG. 1. The IDAC 16 is therefore provided with a digital representation consisting of a 5 bit IDAC code. The IDAC code is set by the digital control module 12 and is changed according to the algorithms described herein. This IDAC code encodes an output current for supplying to the power terminal of the Pierce inverter 20.

In this example, the system also has an optional startup mode, occurring before the main algorithm(s), which supplies a large current to the Pierce Inverter 20 to achieve faster start-up of the Pierce oscillator 3. This startup mode is shown in FIG. 2.

Figure 2:
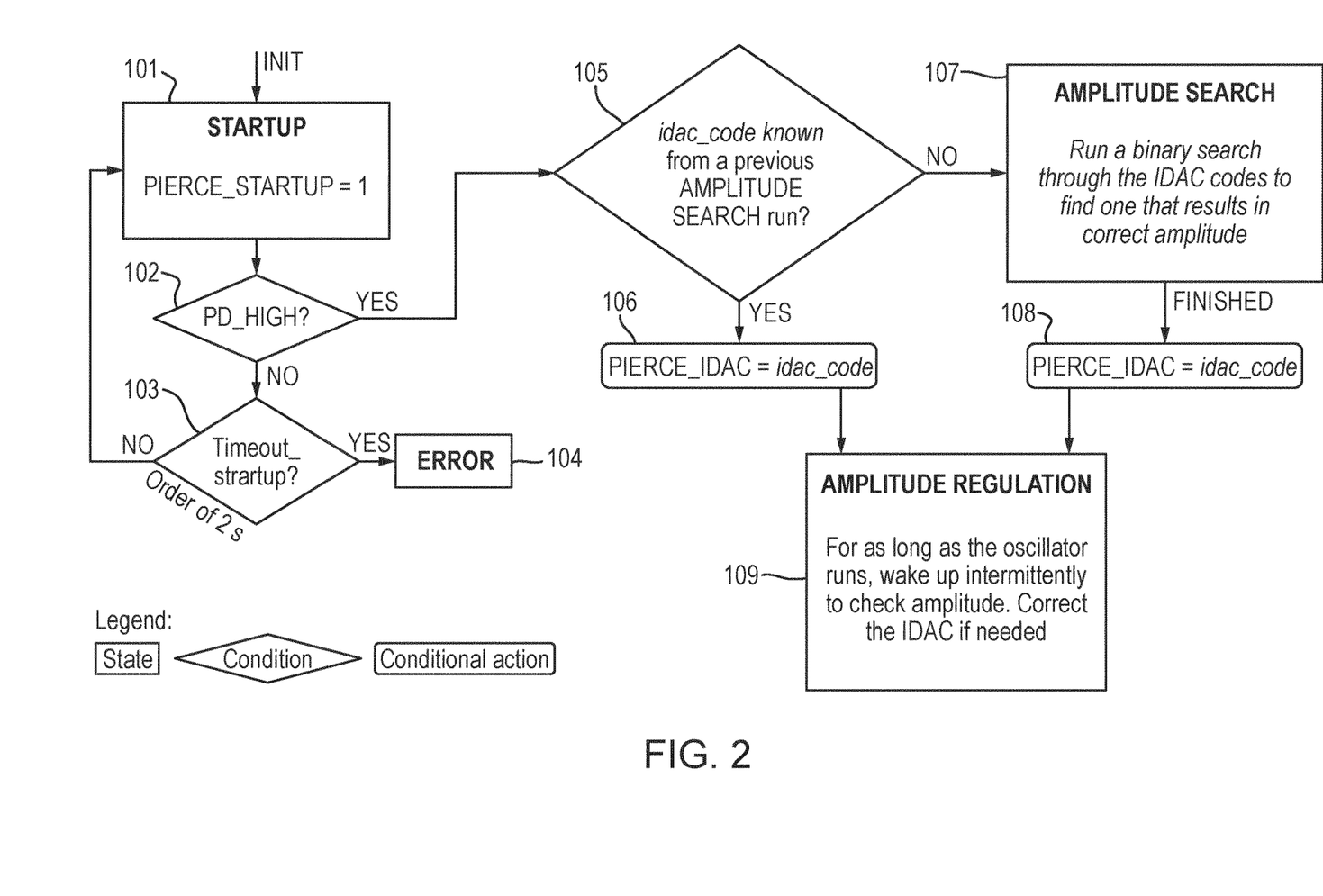
FIG. 2 is a flow-chart showing a method for digitally regulating the amplitude of an oscillator in accordance with an embodiment of the invention.

The Pierce oscillator amplitude can in fact be controlled in three different ways all of which are shown in FIG. 2. Firstly, a simple startup algorithm (described above) supplies a large current (850 nA) to the crystal 26—e.g. large enough to begin oscillation in all crystal types in a suitable amount of time—and the resulting amplitude is monitored by the peak detector 6. Providing this large current helps to ensure a successful startup of the Pierce oscillator 3 in a reasonable time frame. The oscillations may successfully start without the startup algorithm, however, it is likely to take longer.

After the startup mode, an initial amplitude search algorithm 107 runs to quickly find a correct IDAC code for steady state operation, unless a previously determined digital representation (IDAC code) is stored in the memory and can be used directly when the oscillator 3 is restarted. After an IDAC code has been found (e.g. from the amplitude search algorithm 107 or by fetching a stored IDAC code from memory), an amplitude regulation algorithm 109 is used to monitor the amplitude intermittently to ensure that the amplitude stays within a 'legal' range between the upper and lower thresholds, and to change the IDAC code if it is not.

An overview of the startup, amplitude search and amplitude regulation algorithms is shown in FIG. 2.

Startup Algorithm

The startup algorithm operates in the following way:

At step 101, the node PIERCE_STARTUP is set high. This injects a large current into the crystal 26 and begins oscillation of the Pierce oscillator 3. After 2 ms the peak detector 6 is enabled using the PD_EN signal (not shown) and the peak detector begins monitoring the oscillation amplitude at the node $X_o$. The system waits for a predetermined amount of time for the peak detector outputs 8, 10 to be considered valid. In this case, the waiting time is set as 2 ms. This helps to ensure that the peak detector 6 has been given sufficient time to provide a valid output. Thus the outputs of the peak detector 6 are considered valid after additional 2 ms.

As a large current is initially provided in the startup mode, it is expected that the PD_HIGH flag will trigger in response to a high oscillation amplitude. At step 102, the PD_HIGH flag triggers at one of the peak detector outputs 8 which indicates that oscillations have successfully been started and that the startup mode is complete. The algorithm then can proceed to step 105. However, if a predetermined time elapses at step 103 without PD_HIGH being triggered an error state is entered at step 104. This indicates that the oscillator 3 cannot start and may be a sign that the crystal 26 is incorrectly inserted.

Following the startup algorithm, at step 105, either a previous IDAC code is retrieved from memory and is set as the current IDAC code at step 106 (e.g. if known from a previous amplitude search run) or an initial amplitude search algorithm is triggered at step 107.

After the initial amplitude search algorithm 107 determines a suitable IDAC code at step 108, the amplitude regulation algorithm 109 takes over. Alternatively, a suitable IDAC code is retrieved from a memory at step 106—e.g. from a previous initial amplitude search algorithm with the same load capacitance and crystal. The suitable IDAC code is used as the IDAC code (i.e. the initial bias current) for the amplitude regulation algorithm 109. The operation of the amplitude regulation algorithm will be described in more detail later.

Firstly, the operation of the initial amplitude search algorithm will be explained with reference to FIGS. 1, 2 and 3.

Initial Amplitude Search Algorithm

As explained above, the initial amplitude search algorithm 107 performs a binary search to quickly find the correct IDAC code before the amplitude regulation algorithm 109 takes control. In short, the initial amplitude search algorithm 107 is used to find the IDAC code which is to be used as the initial condition for the amplitude regulation algorithm 109. In this example, the initial amplitude search algorithm 107 is implemented in software.

As the correct IDAC code primarily depends on the crystal and load capacitance used, it is sufficient to run the amplitude search algorithm 107 once if both remain the same. The initial amplitude search algorithm is preferably run when the circuit portion is on a chip which has been installed on the correct printed circuit board (PCB) with the correct crystal and the correct load capacitance. This helps to ensure that the IDAC code is suited to the actual operating conditions. In this example, a change of crystal or load capacitance re-triggers the amplitude search algorithm. This is because such a change will also alter the required current (and corresponding IDAC code) for providing a suitable oscillation amplitude.

Figure 3:
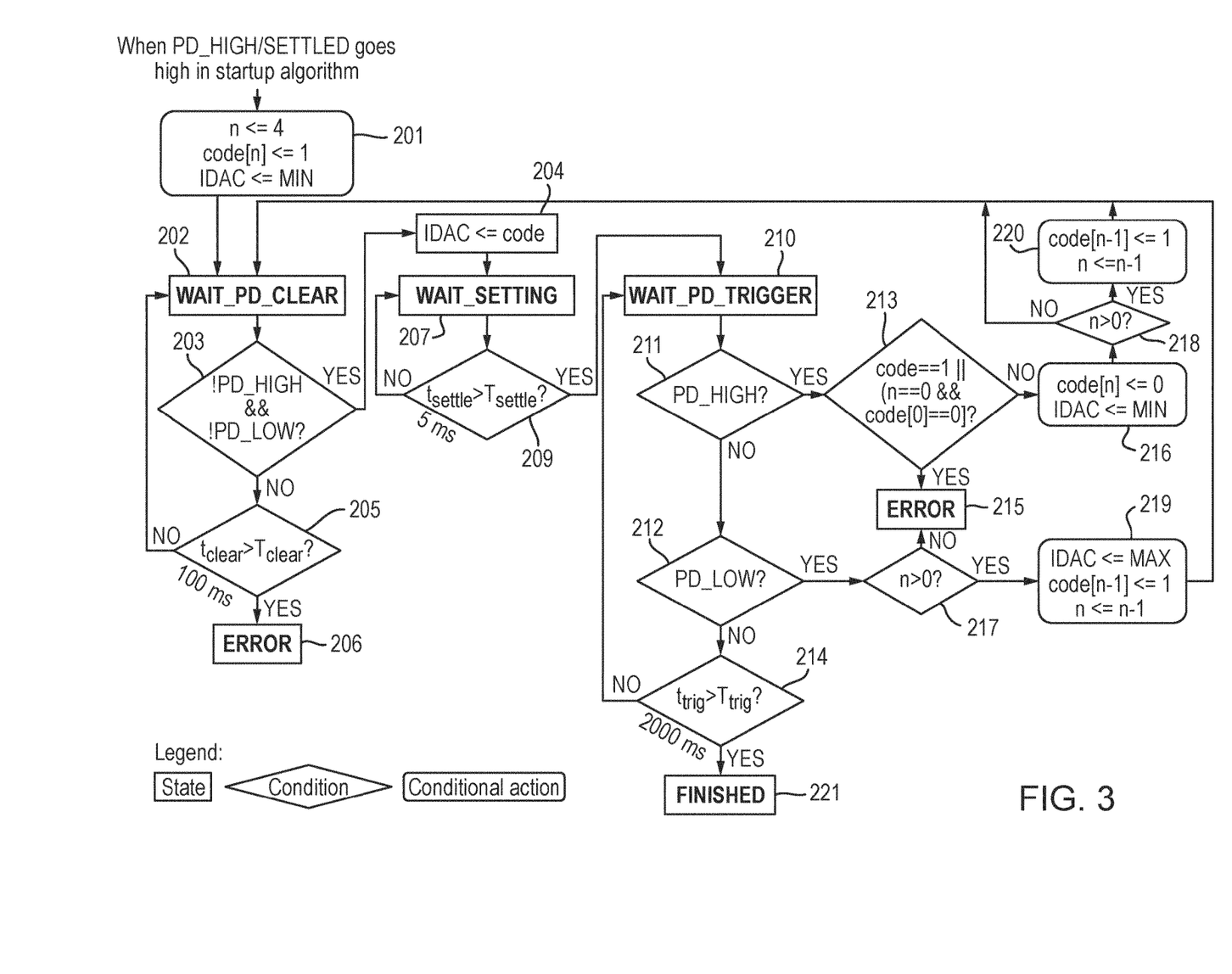
FIG. 3 is a flow-chart showing the amplitude search algorithm of FIG. 2 in more detail.

The flowchart of FIG. 3 outlines the steps of the initial amplitude search algorithm in more detail. The initial amplitude search algorithm will now be described step-by-step with reference to FIGS. 1 and 3. Some of the variables used in the flowchart are defined below:

IDAC: The physical IDAC bus;
code: The current IDAC code estimate. IDAC may be set equal to 'code' during the search, but not always;
n: The active bit in the binary search;
MIN: Constant holding minimum IDAC code. Typically 1 (for a 5 bit code); and
MAX: Constant holding maximum IDAC code. Typically 31 (for a 5 bit code).

There are three different running states in the amplitude search algorithm of FIG. 3, WAIT_PD_CLEAR 202, WAIT_SETTLING 207 and WAIT_PD_TRIGGER 210. The purpose of each of these states will now be described:

WAIT_PD_CLEAR 202:

This state is entered each time one of the peak detector 6 flags PD_HIGH or PD_LOW has 'triggered' (i.e. has been asserted), with the purpose of clearing a triggered flag. That is, if PD_HIGH triggers, then the oscillation amplitude is above the upper threshold. Therefore, the IDAC code is set to a minimum value and a corresponding low bias current is supplied to the Pierce oscillator 3 via the IDAC output 18. The system waits in this state, supplying a low current to the Pierce oscillator 3, until the oscillation amplitude at the node $X_o$ has decreased and the flag PD_HIGH has cleared. Alternatively, if the flag PD_LOW triggers, this means that the oscillation amplitude is below the lower threshold and the IDAC code is set to a maximum value to supply a corresponding high bias current to the Pierce oscillator 3. The system waits in this state, supplying a high current to the Pierce oscillator 3, until the flag PD_LOW has cleared. This mechanism is a safety feature that ensures that, at the start of each step of the binary search, neither of the flags PD_HIGH or PD_LOW are asserted at the peak detector outputs 8, 10. If one of the flags is not cleared within a predetermined clearing time (i.e. $t_{clear} > T_{clear}$, $t_{clear}$ being the time spent waiting for the flags to clear), an error state is entered at step 206. The clearing time ($T_{clear}$) is set as 100 ms in this example.

WAIT_SETTLING 207:

If it is determined that neither of the peak detector flags are triggered at step 203, the IDAC output 18 is set to the current IDAC code estimate (i.e. the parameter 'code') at step 204. Upon supplying the bias current ($I_{PIERCE}$) encoded by the said current IDAC code estimate, the WAIT_SETTLING state is entered at step 207. Here, the system waits a predetermined settling time for transients associated with the switching to die out. The settling time ($T_{settle}$) may be set as 5 ms. When $t_{settle} > T_{settle}$ ($t_{settle}$ being the time spent waiting for the output to settle), the algorithm proceeds to step 210.

WAIT_PD_TRIGGER:

In this state a binary search is performed. At step 210, the system waits for either PD_HIGH or PD_LOW to trigger (and takes appropriate actions accordingly). The waiting time $T_{trig}$ in this example is set as 2 s. If neither PD_HIGH nor PD_LOW are triggered within a certain time, (e.g. $t_{trig} > T_{trig}$, $t_{trig}$ being the time spent waiting for either flag to trigger), then the search is declared finished at step 221.

An exemplary implementation of the initial amplitude search algorithm is explained step-by-step as follows, with reference to the flowchart of FIG. 3:

The flag PD_HIGH triggers in response to the large current supplied in the startup mode (which results in an oscillation amplitude at the node $X_o$ above the upper threshold). After this, at step 201, the active bit is set as n=4 (i.e. the most significant bit), and the initial IDAC code estimate is set to code=5'b10000, with the IDAC output set to MIN in order to clear the flag. In general the initial IDAC code estimate is chosen to have the median value (e.g. 16) of the range of possible values (e.g. 1 to 31 for a 5-bit IDAC). The WAIT_PD_CLEAR state is entered at step 202 and because a relatively small current is being applied to the Pierce oscillator 3 (i.e. IDAC=MIN), the oscillation amplitude at the node $X_o$ decreases and the flag PD_HIGH is cleared at step 203.

At step 204, the IDAC is set equal to the parameter 'code' (the current IDAC code estimate) and the system waits for initial settling in the WAIT_SETTLING state at step 207 for approximately 5 ms.

The algorithm then progresses to the WAIT_PD_TRIGGER state at step 210, and the system waits either for peak detector flags to be triggered (at step 211 or 212) or for timeout (at step 214) if neither flag triggers within approximately 2 s. If a flag is triggered, appropriate actions are performed (which are outlined below) and the process returns to step 202 in the WAIT_PD_CLEAR state to clear the flag.

The actions taken responsive to detecting a PD_LOW flag at step 212 are as follows:

If PD_LOW triggers the oscillation amplitude measured by the peak detector 6 is below the lower threshold and is thus outside of the 'legal' range. At step 219, the active bit of the IDAC code is left set high, and the next bit is set high. The active bit 'n' is then decremented (e.g. from n=4 to n=3). This gives an updated current IDAC code estimate (i.e. 'code'). At the same time, the IDAC output 18 is set to MAX to quickly clear the peak detector flag PD_LOW.

Prior to this, at step 217, a fault condition is checked. If PD_LOW triggers while n>0 is not true, this means that the active bit is the least significant bit. Thus there is no next bit to set, and an error state is entered at step 215.

The actions taken responsive to detecting a PD_HIGH flag at step 211 are as follows:

If PD_HIGH triggers, the oscillation amplitude at the node $X_o$ measured by the peak detector 6 is above the 'legal' range—i.e. above the upper threshold. At step 216, the active bit is set low. If n is larger than 0, meaning that the active bit is not the least significant bit, then the next bit is set high and n is decremented. At the same time, the IDAC output 18 is set to MIN to quickly clear the flag.

Prior to this, at step 213, a fault condition is checked. It is important to note, that the condition n>0 (used for PD_LOW) does not work to detect an error for PD_HIGH because when the active bit is the least significant bit, the algorithm may still invert the active bit to encode a lower current. Instead two further fault conditions are checked. The first is if 'code' is equal to 1. It makes no sense to clear the active bit in this case as this will provide no current to the crystal 26. The second condition is that the active bit is the least significant bit (n=0) and the value of the IDAC code is zero (code[0]=0). This means that the active bit has already been set back to zero, but PD_HIGH somehow triggered again. Nothing more can be done to lower the amplitude.

The system should never enter these error states if legal operating conditions (including crystal parameters) are met. For instance, the start-up current should be large enough to start oscillation in all allowed crystals, and the IDAC least significant bit and peak detector thresholds are set such that at least one correct IDAC code exists for all allowed crystals.

Adjusting the current in the way laid out above (i.e. through a binary search) is complicated by the very long time constants of the oscillation loop, which is on the order of 50-100 ms. This can affect stability as well as power consumption, as the peak detector 6 and digital control module 12 may use a significant amount of power. Therefore, after using the initial amplitude search algorithm to find the suitable IDAC code, the system switches to a less demanding algorithm—herein referred to as the amplitude regulation algorithm. The amplitude regulation algorithm helpfully checks the oscillation amplitude at the node $X_o$ intermittently, and otherwise puts the control loop to sleep to conserve power.

Figure 4:
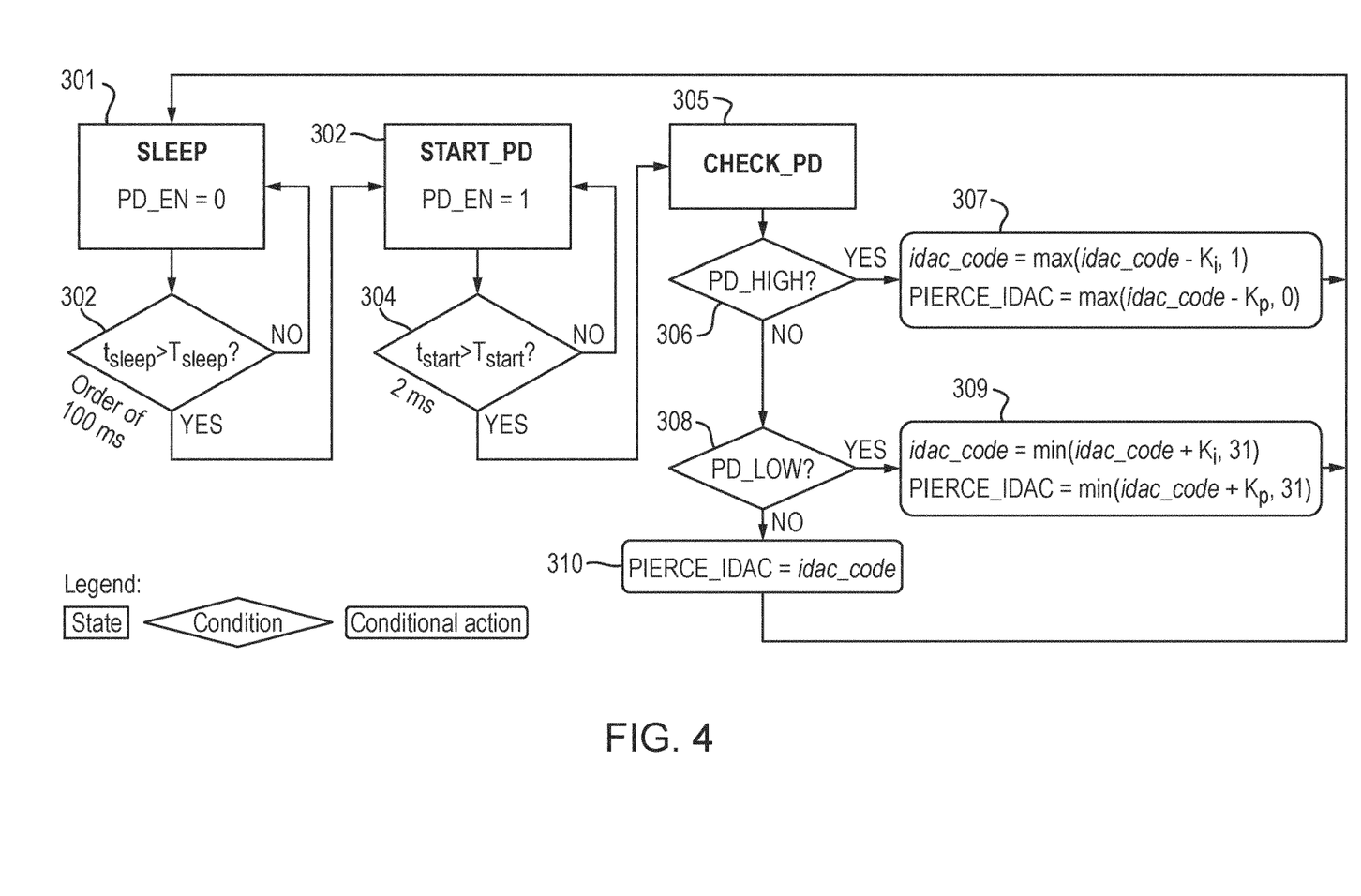
FIG. 4 is a flow-chart showing the amplitude regulation algorithm of FIG. 2 in more detail.

FIG. 4 shows the amplitude regulation algorithm 109 of FIG. 2 in more detail. It will be appreciated that the initial condition for this algorithm—i.e. an IDAC code estimate (digital representation)—may be set as a median value, found by the amplitude search algorithm or may be retrieved from a memory.

Amplitude Regulation Algorithm

In this example, the initial amplitude search algorithm described above finds an IDAC code that brings the oscillation amplitude into the legal region (between the upper and lower thresholds). However, it is assumed that that IDAC code might be wrong at some later point, primarily because the operating temperature may change.

The amplitude regulation algorithm is thus provided to periodically check for peak detector flags, and correct the IDAC code if necessary. Preferably, the amplitude regulation algorithm runs even when the chip is in system off. This may be achieved by implementing the amplitude regulation in the digital hardware. The initial amplitude search algorithm will now be described with reference to FIG. 4. It is envisioned that the algorithm continues in a loop indefinitely.

Similarly to the initial amplitude search algorithm, there are three different running states in the amplitude regulation algorithm of FIG. 4 (SLEEP 301, START_PD 303 and CHECK_PD 305).

At step 301 the process waits in a sleep state for a predetermined time $T_{sleep}$ (approximately 100 ms). The peak detector 6 is disabled in this state to save power by setting PD_EN to low. During this time, the peak detector 6 draws little to no current. Then at step 302, the time spent in the sleep state ($t_{sleep}$) is compared with the parameter $T_{sleep}$. If $t_{sleep}$ is determined to exceed $T_{sleep}$ then the algorithm proceeds to step 303 where the peak detector 6 is enabled i.e. PD_EN is set to high.

At step 304, the system waits for a predetermined time $T_{start}$~ 2 ms before the peak detector outputs 8, 10 are checked. This helps to ensure that the peak detector 6 has been given sufficient time to provide a valid output—e.g. by setting a PD_HIGH or PD_LOW flag. Following this short wait period, at step 305, the output flags are checked in the CHECK_PD state, and appropriate actions are taken.

The actions taken responsive to detecting a PD_HIGH flag at step 306 are as follows:

If a PD_HIGH flag is triggered, then this means the oscillation amplitude has become too high. This could be due to a temperature change that occurred during the time spent in the sleep state. At step 307, the current IDAC code (idac_code) is decremented by a constant ($K_i$), but is never set lower than 1. The IDAC output PIERCE_IDAC is not set equal to the updated idac_code, but to the even lower value idac_code—$K_p$ ($K_p$ is also a constant) (where $K_p$ is subtracted from the updated IDAC code—i.e. after subtracting $K_i$). This is a temporary measure to quickly clear the PD_HIGH flag. If the result of 'idac_code—$K_p$' is negative, then the code is set to zero. The algorithm loops back to step 301 and the peak detector is disabled in the sleep state. In some cases, the constant $K_p$ may be set to zero in order to simplify the amplitude regulation algorithm. Therefore, the algorithm would effectively not carry out this temporary measure.

The actions taken responsive to detecting a PD_LOW flag at step 308 are as follows:

If a PD_LOW flag triggers, the oscillation amplitude has become too low. At step 309, the current IDAC code (idac_code) is incremented by $K_i$, but is never set higher than 31. The IDAC output PIERCE_IDAC is not set equal to 'idac_code', but to the even higher value idac_code+$K_p$ (but never higher than 31). This is temporary—to clear the PD_LOW flag. The algorithm loops back to step 301 and the peak detector is disabled in the sleep state.

The actions taken if no flags are triggered are as follows:

If neither flag (PD_HIGH or PD_LOW) triggers, then the oscillation amplitude measured by the peak detector 6 is determined to be acceptable—i.e. between the upper and lower thresholds. In this case, the IDAC output PIERCE_IDAC is set equal to the current code estimate (idac_code). That is, any earlier temporary offset by $K_p$ is now removed. The algorithm loops back to step 301 and the peak detector is again disabled in the sleep state.

In short, the amplitude regulation algorithm works by regularly checking the peak detector flags, and incrementing or decrementing the IDAC code by $K_i$ each time there are violations (i.e. each time a flag is triggered). Additionally, the IDAC code is temporarily shifted up or down by $K_p$ until the violations are resolved (i.e. until both flags are cleared/unset). Setting this temporary IDAC output speeds up the amplitude correction process.

It is important to note that changing the IDAC code by $K_i$ will cause accumulating IDAC code changes as long as there are violations, whereas changing the IDAC code by $K_p$ will only make a static code offset until violations are resolved.

The system described in relation to the amplitude regulation algorithm is loosely related to a proportional integral (PI) regulator. The idac_code may be equated to the integrator value, $K_p$ being the proportional gain, and $K_i/(T_{sleep}+T_{start})$ being the integral gain. $T_{sleep}$, $K_i$, and $K_p$ must be set to appropriate values. The best values are those that result in a stable regulation loop with no overshoot, and that provide fast regulation.

$T_{sleep}$ is ideally set such that it is not possible to go from a legal amplitude (no flags) to a non-functional clock within the interval (i.e. the interval between checks). This will depend on the effect and speed of temperature change which, in general, is unknown. Total loss of driving power can be modelled and used as an (unrealistic) very worst-case consideration. In this case amplitude declines exponentially with time constant L/ESR (crystal parameters), and is typically in the region of 40 ms—140 ms. Furthermore, the PD_LOW flag is triggered at around 90 mVpp, and the output clock is functional down to around 25 mVpp (where Vpp=peak-to-peak voltage). Without any drive, this decay will happen at −ln(25/90)=1.3 time constants. From this it is concluded at $T_{sleep}$=L/ESR is a reasonable and safe value as long as $K_i$ and $K_p$ are set such that the regulation is sufficiently fast.

By trial and error, it has been found that $K_i$=$K_p$=floor (idac_code/2) works well, where idac_code is the code found during the initial amplitude search algorithm of FIG. 3.

A summary of exemplary parameters is given below in Table 1, along with suggested values, and suggested format/range.

The regulation loop remains stable around the suggested parameters. This means that it may be possible to set static values that will work sufficiently well for all supported crystals.

TABLE 1

Parameters for the amplitude regulation algorithm.

| Parameter | Description | Suggested value | Suggested range/format |
|---|---|---|---|
| $T_{sleep}$ | Time between peak detector startups/checks. | Equal to crystal parameters L/ESR. This will usually fall in the range 40-140 ms. | Set as N × 256 clock cycles with N = [1 32] (5-bit). Range in ms is then between 7.8 ms and 250 ms. |
| $K_i$ | How many codes to step up/down each time the peak detector triggers (integral gain). | floor(idac_code/2) | Set as a 3-bit value ranging from 0 to 7. |
| $K_p$ | How many codes to shift up/down as long as the peak detector is triggered (proportional gain). | floor(idac_code/2) | Set as a 3-bit value ranging from 0 to 7. |

It will be appreciated by those skilled in the art that the invention has been illustrated by describing one or more specific embodiments thereof, but is not limited to these embodiments; many variations and modifications are possible, within the scope of the accompanying claims.

The invention claimed is:

1. A method, the method comprising regulating an amplitude of an oscillator using an amplitude regulation algorithm, the amplitude regulation algorithm comprising:
   a) acquiring a digital representation encoding a bias current;
   b) monitoring an oscillation amplitude of the oscillator at a node using one or more peak detectors;
   c) using the peak detector(s) to carry out a comparison of the oscillation amplitude at the node with an upper amplitude threshold and a lower amplitude threshold,
   d) if the comparison determines that said oscillation amplitude is greater than said upper amplitude threshold, updating said digital representation to encode a reduced bias current and storing said updated digital representation;
   e) if the comparison determines that said oscillation amplitude is lower than said lower amplitude threshold updating said digital representation to encode an increased bias current and storing said updated digital representation;
   f) entering a sleep state wherein the peak detector(s) is/are disabled before repeating steps b) to e) using said updated digital representation as said digital representation; and
   g) intermittently enabling the peak detector(s) between sleep states and running steps b) to e) of the amplitude regulation algorithm.

2. The method of claim 1, comprising entering the sleep state without updating the digital representation if the oscillation amplitude is between the upper amplitude threshold and the lower amplitude threshold.

3. The method of claim 2, comprising maintaining the sleep state for a predetermined time, wherein the oscillator comprises a crystal having an inductance and an equivalent series resistance and said predetermined time is within ±20% of the inductance divided by the equivalent series resistance of the crystal.

4. The method of claim 1, comprising updating the digital representation by incrementing or decrementing said digital representation by a first constant.

5. The method of claim 4, comprising, after updating the digital representation by incrementing or decrementing said digital representation by said first constant, subsequently supplying a bias current to the oscillator encoded by a temporary digital representation comprising the updated digital representation additionally shifted up or shifted down by a second constant, before supplying the bias current encoded by the updated digital representation.

6. The method of claim 4, comprising, after updating the digital representation by incrementing or decrementing said digital representation by said first constant, subsequently:
   determining a value of a temporary digital representation comprising the updated digital representation additionally shifted up or shifted down by a second constant; and
   if the value of the temporary digital representation is between a maximum or minimum value, supplying a bias current to the oscillator encoded by the temporary digital representation; or if the value of the temporary digital representation is above a maximum value, supplying a bias current encoded by a temporary digital representation having said maximum value; or if the value of the temporary digital representation is below a minimum value, supplying a bias current encoded by a temporary digital representation having said minimum value;

before supplying the bias current encoded by the updated digital representation.

7. The method of claim 5, comprising changing the temporary digital representation to the updated digital representation after determining, using the one or more peak detector(s), that the oscillation amplitude is within said upper amplitude threshold and said lower amplitude threshold.

8. The method of claim 1, comprising first carrying out an initial search algorithm to determine a digital representation encoding a bias current which gives an oscillation amplitude within said upper amplitude threshold and said lower amplitude threshold, the initial search algorithm comprising:

g) acquiring an initial digital representation encoding a bias current, and setting an active bit as a most significant bit thereof, the most significant bit having a first value;

h) monitoring the oscillation amplitude at the node using the one or more peak detectors;

i) using the peak detector(s) to carry out a comparison of the oscillation amplitude at the node with the upper amplitude threshold and the lower amplitude threshold at the one or more peak detectors;

j) if the comparison determines that said oscillation amplitude is greater than said upper threshold, updating said initial digital representation by inverting the active bit to a second value to encode a reduced bias current and, if said active bit is not a least significant bit, setting a next most significant bit to said first value and setting said next most significant bit as the active bit:

k) if the comparison determines that said oscillation amplitude is lower than said lower threshold updating said initial digital representation by maintaining the active bit or setting the active bit to said first value and setting a next most significant bit to said first value to encode an increased bias current and setting said next most significant bit as the active bit; and l) repeating steps h) to k) using said updated digital representation as said initial digital representation.

9. The method of claim 8, comprising using the digital representation determined by the initial search algorithm as the digital representation in step a).

10. The method of claim 9, wherein the initial digital representation of the initial search algorithm has a median value of a range of possible values.

11. The method of claim 8, comprising the initial search algorithm entering an error state if the comparison determines that said oscillation amplitude is above said upper amplitude threshold and the digital representation has a minimum value of a range of possible values.

12. The method of claim 8, comprising the initial search algorithm entering an error state if, after all bits of the digital representation have been the active bit, the digital representation does not bring the oscillation amplitude between the upper and lower thresholds.

13. The method of claim 8, wherein the initial search algorithm comprises, upon determining that the oscillation amplitude is greater than said upper amplitude threshold, temporarily setting the digital representation to a minimum value until the oscillation amplitude at said node has decreased to be below said upper amplitude threshold.

14. The method of claim 8, wherein the initial search algorithm comprises, upon determining that said oscillation amplitude is lower than said lower amplitude threshold, temporarily setting the digital representation to a maximum value until the oscillation amplitude at said node has increased to be higher than said lower amplitude threshold.

15. The method of claim 8, wherein the initial search algorithm comprises entering an error state if, after setting the digital representation to a minimum or maximum value, a predetermined time has passed without the one or more peak detectors determining that the oscillation amplitude at the node is between said lower amplitude threshold and said upper amplitude threshold.

16. The method of claim 8, wherein the initial search algorithm comprises waiting a predetermined time after setting the digital representation to the updated digital representation and before monitoring the oscillation amplitude at the node using the one or more peak detectors.

17. The method of claim 8, wherein the initial search algorithm comprises, waiting for a waiting time for the one or more detectors to determine whether the oscillation amplitude is higher than the upper threshold or lower than the lower threshold and, if said waiting time exceeds a predetermined time, terminating the initial search algorithm.

18. The method claim 8, comprising carrying out the initial search algorithm using software and carrying out the amplitude regulation algorithm using digital hardware.

19. The method of claim 8, comprising triggering the initial search algorithm upon a change of crystal in the oscillator and/or upon a change in load capacitance.

20. The method of claim 8, comprising, prior to the initial search algorithm, setting an initial bias current so that the oscillation amplitude exceeds the upper amplitude threshold.

21. The method of claim 8, wherein the bias current is provided by a current analogue to digital converter.

22. The method of claim 8, wherein the oscillator is a Pierce oscillator.

23. A method for controlling a bias current of an oscillator having an oscillation amplitude, the method comprising:

carrying out an initial search algorithm, to determine a digital representation encoding a bias current for providing an oscillation amplitude between an upper threshold and a lower threshold;

applying a bias current to said oscillator using a digitally controlled current generated based on said determined digital representation; and subsequent to the initial search algorithm, carrying out an amplitude regulation algorithm to update the digital representation if the oscillation amplitude is measured, by one or more peak detectors, to be outside of said upper and lower thresholds, the amplitude regulation algorithm being different to the initial search algorithm.

24. An apparatus, the apparatus comprising:

one or more peak detectors; and a current digital to analogue converter;

wherein the apparatus is arranged to regulate an amplitude of the oscillator using an amplitude regulation algorithm, wherein the amplitude regulation algorithm is arranged to:

a) acquire a digital representation, for the current digital to analogue converter to receive, said digital representation encoding a bias current for supplying to the oscillator;

b) monitor an oscillation amplitude of the oscillator at a node using the one or more peak detectors; and
c) use the peak detector(s) to carry out a comparison of the oscillation amplitude at the node with an upper amplitude threshold and a lower amplitude threshold, wherein:
d) if the comparison determines that said oscillation amplitude is greater than said upper amplitude threshold, update said digital representation to encode a reduced bias current and store said updated digital representation;
e) if the comparison determines that said oscillation amplitude is lower than said lower amplitude threshold, update said digital representation to encode an increased bias current and store updated digital representation;
f) enter a sleep state wherein the peak detector(s) is/are disabled, and repeat steps b) to e) using said updated digital representation as said digital representation;
g) intermittently enable the peak detector(s) between sleep states and steps b) to e).

* * * * *